Jan. 17, 1967 D. W. HACKETT ETAL 3,299,366
TEMPERATURE COMPENSATED AMPLIFIER
Filed May 27, 1963
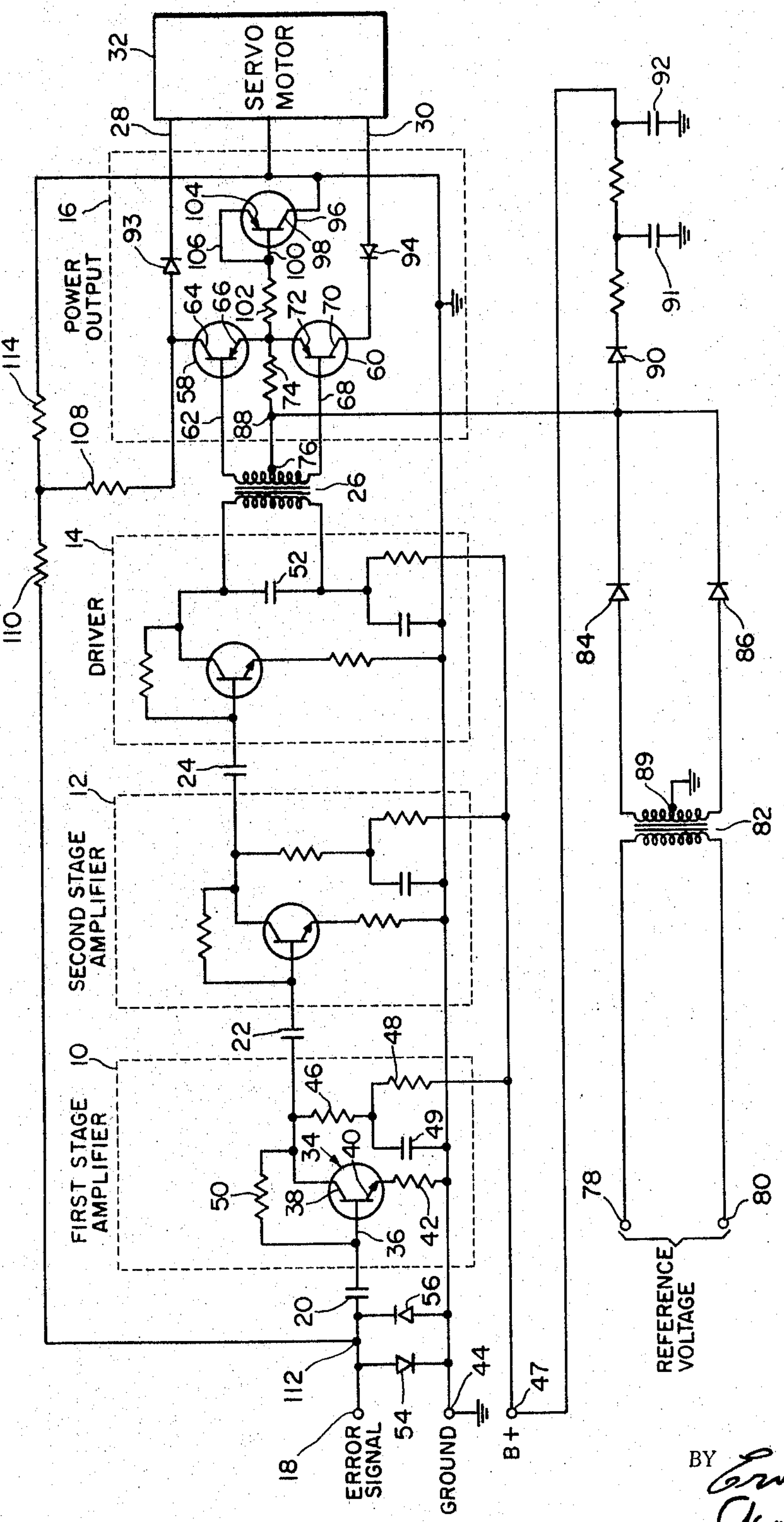
INVENTORS
DAVID W. HACKETT
ANDRE J. HUOT
BY Erwin F. Johnston
George J. Rubens
ATTORNEYS United States Patent Office 3,299,366

Patented Jan. 17, 1967

3,299,366

TEMPERATURE COMPENSATED AMPLIFIER

David W. Hackett, Burbank, and Andre J. Huot, North Hollywood, Calif., assignors, by mesne assignments, to the United States of America as represented by the Secretary of the Navy Filed May 27, 1963, Ser. No. 283,648

1 Claim. (Cl. 330—23)

The present invention relates to a temperature compensated amplifier and more particularly to a transistorized push-pull amplifier which is compensated for leakage current in the transistors in the push-pull stage due to junction temperatures therein.

When a pair of transistors are operated class B in a push-pull amplifier without the application of any signal, there exists a problem of the transistors being driven to a state of conduction. This condition is undesirable since the transistors should conduct only when a signal is applied. This conduction is brought about by a temperature at the junction of the transistors which results in a leakage current, this current increasing exponentially with an increase in the junction temperature. Assuming a pair of PNP transistors operated class B and in a non-conducting state the base is biased more positive than the emitter or it can be said that the transistor is biased in the reverse direction. As the leakage current increases with temperature this current tends to put the transistor into a state of conduction. If the transistor is thought of as represented by a T-network, it can be shown that the resistance in the emitter leg is much less than the resistance in the base leg. Therefore, the main part of the leakage current flows from the collector to the emitter. The problem can readily be seen when the transistorized push-pull amplifier is used in conjunction with servomotor type loads wherein we are dealing with a low D.C. resistance. Here there would be a condition of large current and voltage in the transistor which can eventually burn out the transistor. The problem is to compensate for the leakage current which tends to bias the transistor in the forward direction without any applied signal. Various methods have been employed in the prior art to provide external compensating circuits which will compensate for the leakage current in the transistors, however, these methods have been unduly complex and/or incapable of an exact compensation, that is the transistors have either been overcompensated or still continue to conduct without the application of any signal. The present invention overcomes this problem by providing a third transistor which is identical to the pair of transistors and is connected in a particular manner thereto. As the leakage current in the third transistor increases it applies a certain amount of reverse bias to the pair of transistors to compensate for the forward bias condition occurring due to leakage therein. Since the third transistor is identical to the pair of transistors the leakage current from it will closely approximate the leakage current of the pair of transistors and consequently can be used to cancel the effect of the leakage in the pair of transistors. Accordingly, the present invention will tend to eliminate any residual effects which have been a problem in the prior art.

An object of the present invention is to provide a device which substantially compensates for leakage current within a push-pull amplifier.

Another object is to provide a push-pull amplifier employing a pair of germanium transistors in the push-pull stage with means for substantially compensating for leakage current in the pair of transistors when the amplifier is not receiving any signal.

A further object of the invention is to provide a transistorized push-pull amplifier having means for substantially compensating for leakage current within the transistors under a no-signal condition.

Still another object is to provide a servo amplifier which has improved stability.

Yet another object is to provide a servo amplifier having a transistorized push-pull stage which has improved stability under a no-signal condition.

Other objects and many of the attendant advantages of this invention will be readily appreciated as the same becomes better understood by reference to the following detailed description when considered in connection with the accompanying drawing in which like reference numerals designate like parts thereof and wherein the figure is a schematic view of a preferred embodiment of the invention.

Referring now to the drawing, wherein like reference numerals designate like or corresponding parts throughout the several views, there is shown in the figure a servo amplifier having four stages, namely: a first-stage amplifier 10, a second-stage amplifier 12, a driver-stage 14, and a power output stage 16. The type of circuitry in the amplifiers 10 and 12 are identical and the type of circuitry in the driver stage 14 is substantially similar to that in the amplifiers 10 and 12. The servo amplifier has a terminal 18 for receiving an error signal, this terminal being coupled via a capacitor 20 to the amplifier 10. The amplifier 10 is coupled to the second stage amplifier 12 via a capacitor 22 and the amplifier 12 is coupled via a capacitor 24 to the driver stage 14. The driver stage 14 is coupled via a transformer 26 having windings of opposite polarity to the power output stage 16. The power output stage has output leads 28 and 30 which are coupled in any suitable manner to a servomotor 32.

The amplifier 10 has a transistor 34, this transistor having a base electrode 36, a collector electrode 38 and an emitter electrode 40. The emitter electrode 40 is connected via a resistor 42 to a ground terminal 44, the resistor 42 serving as a stabilizing resistor similar to the action of an unbypassed cathode resistor in a vacuum tube amplifier. Resistor 42 tends to decrease the gain of amplifier stage 10 but provides protection against the increase in transistor saturation current with temperature. The collector electrode 38 is connected via a load resistor 46 to a terminal 47 for receiving a B+ voltage. Resistor 48 and capacitor 49 form a decoupling network for amplifier stage 10 to prevent positive feedback occuring in the power supply common to all stages. The collector electrode 38 is further connected via a resistor 50 back to the base electrode 36, the resistor 50 serving to self-bias the transistor 34 to prevent excessive shifts in collector D.C. operating point with temperature change. Accordingly should a temperature rise cause the transistor 34 to shift and draw more collector current this results in an increased voltage drop across the load resistor 46 and a decreased voltage at the collector electrode 38. This causes the bias current through the resistor 50 to be decreased so that the collector will draw less current so as to cancel the temperature shift increase. The reverse is also true, that is, a decrease in collector current flow increases the bias current at the base electrode 36 and results in an increased collector current. As stated before the amplifier 12 is identical in form to the amplifier 10. The driver 14 differs from the amplifiers 10 and 12 only in that transformer 26 which is tuned by capacitor 52 (across the primary winding) is used as a load in place of a resistor like resistor 46. A pair of diodes 54 and 56 are each connected across the terminals 18 and 44 so as to limit the input signal to a predetermined maximum to protect the transistors.

The secondary winding of the transformer 26 is connected to a pair of germanium type transistors 58 and 60, these transistors serving the function of a push-pull amplifier. The transistors 58 and 60 are to be identical and have the same dynamic transfer characteristic. The transistor 58 has a base electrode 62, a collector electrode 64, and an emitter electrode 66 and the transistor 60 has a base electrode 68, a collector electrode 70 and an emitter electrode 72. The emitter electrodes 66 and 72 are mutually connected via a resistor 74 to a center-tap terminal 76 on the secondary winding of the transformer 26, the resistor 74 providing emitter degeneration.

An alternating reference voltage is applied to terminals 78 and 80 and is fully rectified by a transformer 82 and diodes 84 and 86 after which it is applied to a point 88 in the power output stage 16. The use of a full-wave rectified power for the pull stage is possible due to closely controlled phase shift within the amplifier and represents a considerable saving in space, efficiency and heat dissipation as compared with conventional means. The secondary winding of the transformer 82 is grounded at a center-tap position 89 so that in conjunction with diodes 84 and 86 only positive values above ground are passed to the point 88. The output of the diode 84 is fed via a filtering network comprising diode 90, and capacitors 91 and 92, connected to ground for supplying the B+ in the form of a D.C. reference voltage at the terminal 47.

The collector electrode of the transistor 58 is connected to the output lead 28 via a diode 93 and the collector electrode 70 of the transistor 60 is connected via a diode 94 to the output lead 30. These diodes prevent the introduction of any back E.M.F. voltage into the push-pull transistors from the servo motor.

A third transistor 96 is employed in the power output stage 16 and is to be identical to the transistors 58 and 60 and has the same dynamic transfer characteristic as the transistors 58 and 60. The third transistor 96 has a collector electrode 98 which is connected to the ground terminal 44 and has a base electrode 100 which is connected via a resistor 102 to the emitter electrodes 66 and 72 of the transistor 58 and 60 respectively. The transistor 96 has an emitter electrode 104 which is connected back to the base electrode 100 via a feed back loop 106.

The collector electrode 64 of the transistor 58 is connected via resistors 108 and 110 back to the input terminal 18 at a point 112 and is connected via a resistor 114 back to ground terminal 44. This connection provides an overall feedback around the entire servo amplifier so as to establish stability and gain therein.

In the preferred embodiment the transistors within the amplifier stages 10 and 12 and within the driver stage 14 are to be NPN transistors and are to be operated class A. The transistors within the power output stage are to be germanium type PNP transistors and are to be operated class B. It is, of course, to be understood that the PNP type of transistor can be used in lieu NPN type and vice versa with a mere change of biasing voltage so as to obtain the same result as that described in the specification.

In the operation of the device an error signal is fed into the servo amplifier via the input terminal 18 after which it is amplified in the amplifier stages 10 and 12. The amplified signal is then utilized in the driver stage 14 to drive the power output stage 16. The invention is concerned with a condition when there is no applied signal to the servo amplifier, that is, no error signal introduced at the input terminal 18. Under the no-signal condition the base electrodes 62 and 68 of the transistors 58 and 60 respectively are biased more positive than the emitter electrodes 66 and 72. Accordingly, the transistor is biased in a reverse direction. However, as the junction temperatures within the transistors 58 and 60 rise a current inherent to these transistors known as leakage current increases exponentially. This leakage current flows from the collector electrodes 70 and 64 to the emitter electrodes 72 and 66 respectively since the resistance in the emitter of each transistor is much less than the resistance in the base thereof. This leakage current tends to bias each transistor in the forward direction without applied signal so as to cause the transistors to conduct and therefore become unstable. The third transistor 96 overcomes the forward bias of the transistors 58 and 60 by applying a reverse bias thereto which tends to exactly compensate for the forward bias due to the leakage current. The compensation effect of the third transistor 96 is accomplished by utilizing the leakage current therein to provide a predetermined potential drop across the resistor 102 as a function of temperature. Under the no-signal condition the base electrode 100 is biased more positive than the emitter electrode 104 of the transistor 96. In a like manner as in the transistors 58 and 60 a leakage current will flow from the collector electrode 98 to the emitter electrode 104 and then via the feedback loop 106 to the base electrode 100. Because of the leakage current in transistor 96 the transistor is forward biased with the base electrode becoming more negative than the emitter electrode resulting in the potential drop across the resistor 102. The potential drop across the resistor 102 exactly compensates for the forward bias of the transistors 58 and 60 so as to bring them back to a non-conducting state. Accordingly, the transistor 96 will then serve the function of stabilizing the push-pull effect of the transistors 58 and 60 during a no-signal condition. Since the transistor 96 is identical to the transistors 58 and 60 it will follow them exactly and provide an exact compensation which has been heretofore unavailable in the prior art.

Obviously many modifications and variations of the present invention are possible in the light of the above teachings. It is therefore to be understood that within the scope of the appended claim, the invention may be practiced otherwise than as specifically described.

We claim:

A servo amplifier which is stabilized under a no signal condition comprising:

(a) an amplifier transistor having an emitter electrode, a base electrode and a collector electrode;

(b) said base electrode being connected to an input terminal for receiving an error signal;

(c) said emitter electrode being connected via a resistor to a grounded terminal;

(d) said collector being connected via a resistor to a terminal for receiving a power voltage;

(e) a resistor connected between the collector electrode and the base electrode so as to stabilize the transistor upon a temperature rise thereof;

(f) a pair of opposing diodes each connected between the input terminal and the ground terminal for limiting the current of the error signal;

(g) a pair of transistors having substantially identical transfer characteristics;

(h) each of said pair of transistors having an emitter electrode, a base electrode and a collector electrode;

(i) transformer means coupling the collector electrode of said amplifier transistor to the base electrode of each of said pair of transistors;

(j) means connecting the electrodes of said pair of transistors together for class B operation with a first resistor mutually connected between the emitter electrode and base electrode of each transistor for emitter degeneration;

(k) means connecting the collector electrode of one of said pair of transistors to said input terminal so as to provide feedback for stabilizing said servo amplifier;

(l) a third transistor having a dynamic transfer characteristic substantially identical to each of said pair of transistors;

(m) said third transistor having an emitter electrode, a base electrode and a collector electrode;

(n) means connecting a second resistor of a predetermined resistance between the base electrode of said third transistor to the emitter electrodes of said pair of transistors;

(o) the collector electrode of said third transistor being connected to a point of voltage potential; and (p) a feedback loop connecting the emitter electrode of said third transistor to its base electrode, whereby leakage current in the third transistor will cause a voltage drop across said second resistor to oppose the bias of said pair of transistors due to leakage current therein, thereby preventing conduction of said pair of transistors under the no signal condition.

References Cited by the Examiner

UNITED STATES PATENTS

| | | | |
|---|---|---|---|
| 2,802,071 | 8/1957 | Lin | 330—15 |
| 2,863,008 | 12/1958 | Keonjian | 330—15 X |
| 2,883,479 | 4/1959 | Aronson | 330—15 |

ROY LAKE, *Primary Examiner.*

N. KAUFMAN, *Assistant Examiner.*